United States Patent

Glathe

[15] 3,678,294

[45] July 18, 1972

[54] AMPLIFIER STAGE CIRCUIT FOR A LOGARITHMIC AMPLIFIER

[72] Inventor: Wolfgang Glathe, Munich, Germany

[73] Assignee: Schlumberger Overseas Messgeratebau und Vertrieb GmbH, Munich, Germany

[22] Filed: Nov. 10, 1970

[21] Appl. No.: 88,447

[30] Foreign Application Priority Data

Nov. 11, 1969 Germany......................P 19 56 692.8

[52] U.S. Cl...............................................307/230, 328/145

[51] Int. Cl.........................................................H03k 17/00

[58] Field of Search..........................328/145; 307/229, 230; 330/30 D

[56] References Cited

UNITED STATES PATENTS

| | | | |
|---|---|---|---|
| 3,058,057 | 10/1962 | Frost | 328/145 X |
| 2,935,687 | 5/1960 | Eschner, Jr. | 328/145 |

*Primary Examiner*—Donald D. Forrer
*Assistant Examiner*—B. P. Davis
*Attorney*—William R. Sherman, Stewart F. Moore and Jerry M. Presson

[57] ABSTRACT

An amplifier stage for a logarithmic amplifier having a plurality of such stages connected in cascade. Each stage comprises a linear amplifier and a differential amplifier having a common load resistance, a common input terminal and a common output terminal at one end of the load resistance; these two terminals are also the input and output terminals of the stage. The linear amplifier delivers an output which is a linear function of its input over the entire range of permissible input values. The differential amplifier delivers an output which is a linear function of its input for input values below a predetermined limit, and delivers a constant output for input values above this limit. The output of the stage is the sum of the output from the linear amplifier and the output from the differential amplifier. Below the predetermined limit the output of the stage is thus the sum of two linear outputs; above this limit it is the sum of a linear output and a constant output. The gain of the stage is therefore constant below the limit, but falls off above the limit.

1 Claim, 4 Drawing Figures

PATENTED JUL 18 1972 3,678,294

Figure 1:
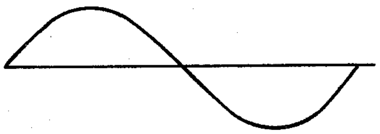

INVENTOR.
Wolfgang Glathe

BY [signature]

ATTORNEY

AMPLIFIER STAGE CIRCUIT FOR A LOGARITHMIC AMPLIFIER

This invention relates to an amplifier stage circuit for a logarithmic amplifier.

Logarithmically operating amplifiers are used for quite a number of purposes, in particular for providing the same relative measurement accuracy for very small amplitudes as well as for very large amplitudes when measuring signals having an amplitude whose variation range is extremely great.

Generally, such amplifiers may be designed in such a manner that an element having a logarithmic characteristic is connected in the signal path from the input to the output of the amplifier or even in the feedback path thereof; for example, diodes may serve this purpose because of their approximately logarithmic characteristic in the vicinity of the bend of the current-voltage curve.

A different circuit has been described in the periodical "-Frequenz" 22, (1968), 5. p. 144 by W.Glathe: "Ein logarithmischer Verstarker hoher Stabilitat und Genauigkeit" ("A logarithmic amplifier having high stability and accuracy"). In accordance with this proposal, a logarithmic characteristic of an amplifier may be achieved with quite a good approximation by arranging that each stage has, for a low-level amplitude range of its input signal, a high gain of, say, 10 dB while in response to amplitudes exceeding a predetermined value the gain drops rapidly to a lower value, say 0 dB (gain 1).

Upon an increase of the input amplitude, at first the last stage will switch to a lower gain, thereafter the last but one stage, and so on, so that an overall characteristic will result which is composed of a number of straight portions, providing an approximately logarithmic relation between input and output signal amplitude.

The circuit embodiment as described by Glathe comprises, in each stage, two diodes biased in such a manner that they shunt the load resistance of the stage, at the predetermined amplitude level, with a further resistance thereby reducing "rapidly" the gain, in so far as a diode may be considered as an "ideal" switch element. It is a matter of course that not only must the diodes be carefully selected and balanced but also separate bias sources must be provided. The latter, more over, must be provided with temperature compensating means to balance the temperature drift of the diodes.

It is the object of the present invention to provide, for the same purposes, an amplifier stage of much simplified construction whose operation results in the same effect, but with much less effort.

The problem is solved in accordance with the invention by a first linear amplifier circuit and by a second amplifier circuit designed as a differential amplifier, the latter operating in the low-level amplitude range of its input signal as a linear amplifier, but delivering a constant output signal for input amplitudes exceeding a predetermined value, both amplifier circuits being provided with a common load resistance.

It is advisable to design the amplifier circuits with transistors. A preferred embodiment is designed in such a manner that the first amplifier circuit is a one-stage transistor voltage amplifier and that the differential amplifier comprises two transistors, a current limiting element being provided in the common emitter connection of the differential amplifier, one of the two transistors of the differential amplifier being controlled with the input signal, the other being controlled with a predetermined constant potential.

As the current limiting element, the collector-emitter path of a transistor may be used which (transistor) is operated at a fixed operating point of its linear collector current/collector voltage characteristic; since the maximum current of the differential amplifier circuit arranged in this way may be very low the temperature drift may be almost completely compensated by providing strong feed back in the current limiting transistor by means of an emitter resistor of sufficient value. It will be understood that the transistor of the first amplifier circuit, too, may be provided with an emitter resistor for the purpose of providing feed back.

Figure 2:
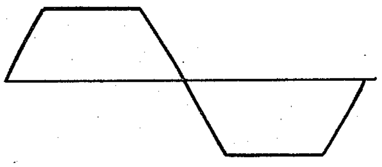
Figure 3:
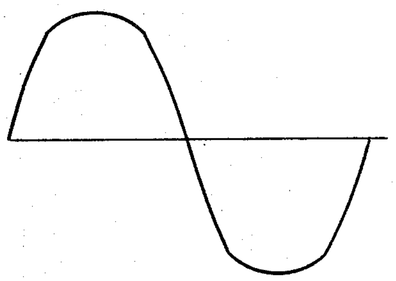
Figure 4:
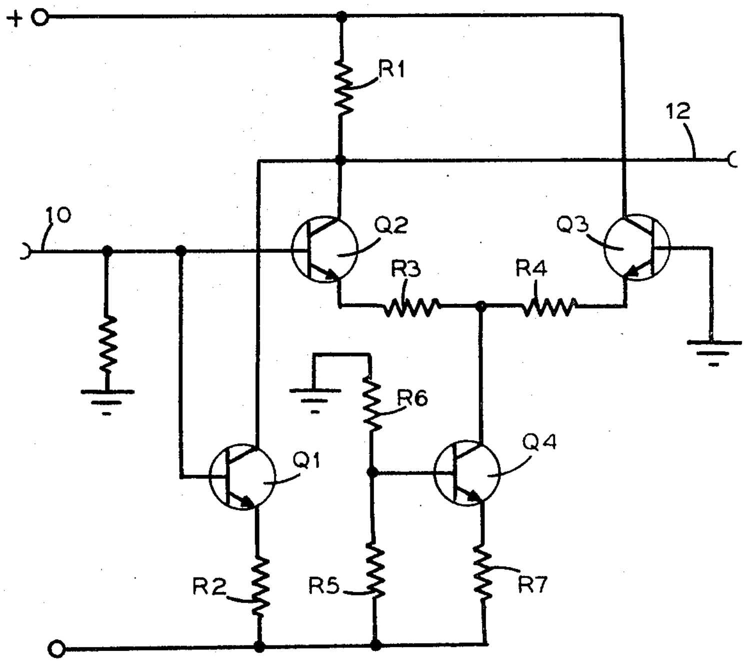

The invention will be described in detail herein below, by way of example, with reference to the accompanying drawings in which:

FIGS. 1–3 show schematically the wave forms of the collector current of the first amplifier circuit (FIG. 1), the collector current of the output transistor of the differential amplifier (FIG. 2), and the sum of both these currents (FIG. 3), at an input signal amplitude level which exceeds the limit value by a small amount; and FIG. 4 shows — simplified to some extent — the preferred circuit embodiment in accordance with the invention.

At first, the construction of the circuit as shown in FIG. 4 will be discussed. The input signal, supplied at 10, is fed to the base electrode of transistor $Q_1$ which operates in the usual common emitter configuration, the transistor thus operating as a voltage amplifier on the load resistance $R_1$. The voltage drop across $R_1$ is fed to the next stage at 12, said next stage being identical with the circuit just under consideration and as shown in FIG. 4. Transistor $Q_1$ is provided with strong negative feed back by means of emitter resistor $R_2$ so that, as known per se, the temperature dependence is reduced.

The input signal at 10 is further fed to the base electrode of transistor $Q_2$ which forms together with transistor $Q_3$ a differential amplifier circuit. The base electrode of $Q_3$ is grounded; the emitters of both transistors $Q_2$, $Q_3$ are connected to the collector of a fourth transistor $Q_4$ via emitter resistors $R_3$ and $R_4$ respectively.

The collector of $Q_2$ is connected to the same load resistance $R_1$ as $Q_1$. Since both transistors are controlled with the input signal in phase, their collector currents add up and so do the voltage drops across $R_1$.

Transistor $Q_4$ has its base electrode connected to the tap of a fixed voltage divider $R_5$, $R_6$. Its emitter resistor $R_7$ serves in a manner known per se as a negative feedback means. Thus, transistor $Q_4$ operates at a predetermined point of its characteristic with the result that its collector current is constant and split between the collector-emitter paths of the transistors $Q_2$ and $Q_3$ which thus form a differential amplifier. For this purpose, the resistors $R_3$ and $R_4$ are so dimensioned that $R_3 = R_4$ with the result that when there is no signal at 10 both transistors have the same collector current. There is no need to provide a load resistor for $Q_3$; no unbalance will occur since both transistors $Q_2$, $Q_3$ are operated in the horizontal portion of their collector current/collector voltage characteristic. A potential variation at 10 results in a corresponding variation in the current ratio between $Q_2$ and $Q_3$ as long as the input signal amplitude at 10 increases to a particular — positive or negative — value, at which the entire current, whose value is given by the transistor $Q_4$ operating as current limiting element, is taken over either by transistor $Q_2$ (input positive) or by transistor $Q_3$ (input negative), as the case may be. A further increase of the input signal is unable to further increase the current through either transistor $Q_2$ or $Q_3$.

Transistor $Q_1$ will now be subjected to negative feed-back to such an extent that its gain is just 0 dB for example, so that it transmits the input signal at 10 to the output terminal 12 with an amplitude ratio of 1 : 1. The gain of the differential amplifier $Q_2$, $Q_3$, however, will be chosen substantially higher, say 10 dB. The sum of the collector currents results in an adding-up of the gains in the small-signal range; while in the range of very high amplitudes of the signal practically just the 1 : 1 transmission by $Q_1$ will take place, the differential amplifier adding just a substantially constant collector current whose value, however, is negligible for high signal amplitudes. For medium amplitudes a certain wave form distortion occurs as shown in FIG. 1–3.

FIG. 1 shows the input wave form at 10 and also that portion of the output signal transmitted by transistor $Q_1$ having a gain of 0 dB, phase shifts not being considered.

FIG. 2 shows the collector current of transistor $Q_2$ for the same input signal. At first, the current increases proportionally to the point where the limiting becomes effective; beginning at this point transistor $Q_2$ provides but a constant collector current until the input signal amplitude drops below a predetermined value. It will be understood that the maximum collector current of $Q_2$ must be adjusted by the proper choice of the voltage divider $R_5$, $R_6$ and of the other resistors.

FIG. 3, finally, shows the wave form of the output signal at 12. It will be noted that the superposition of the collector currents causes a rapid decrease of the gain for such input amplitudes exceeding a predetermined value. Hence, if a plurality of identical stages are cascade-connected, a logarithmic characteristic will result, with a sufficiently good approximation, as explained above.

The circuit as shown is simplified to some extent, as networks for affecting the frequency characteristic, coupling and blocking capacitors are not shown; such elements can be provided if necessary. Since the maximum collector current for transistor $Q_2$ and thus for transistor $Q_3$, too, will be fixed at a relatively low value in comparison with that of transistor $Q_1$ whose control range must exceed that of the differential amplifier by orders of magnitude, transistor $Q_4$ may be driven and in particular provided with negative feed-back such that practically no operating point shift will occur caused by current variations of either $Q_2$ or $Q_3$.

I claim:

1. An amplifier stage for a logarithmic amplifier having a plurality of such stages connected in cascade, said stage having an input terminal and an output terminal and comprising: a linear amplifier comprising a first transistor connected in common emitter configuration with its base connected to said input terminal, with its collector connected to said output terminal and to one end of a first resistance which constitutes the load resistance of said first transistor, and with its base connected to one end of a second resistance which provides negative feedback to said first transistor; a differential amplifier comprising a second transistor and a third transistor, said second transistor being connected with its base connected to said input terminal, with its collector connected to said output terminal, and hence to said one end of said first resistance which then constitutes the load resistance of this second transistor as well, and with its base connected via a third resistance to a single branch which is constrained to carry the entire emitter current of this second transistor; and said third transistor being connected with its base connected to a constant potential, with its collector connected to the other end of said first resistance, and with its emitter connected via a fourth resistance to said single branch, which is therefore constrained to carry the entire emitter current of this third transistor as well; and a fourth transistor connected with its base connected to the tap of a fixed voltage divider comprising a fifth and a sixth resistance connected in series, with its collector connected to the junction of said third and fourth resistances and with its emitter connected to a seventh resistance which provides negative feed-back to said fourth transistor, whereby the collector-emitter path of this fourth transistor forms part of said single branch and carries the sum of the emitter currents of the second and third transistors.

* * * * *